United States Patent
Ji et al.

(10) Patent No.: US 8,236,188 B2
(45) Date of Patent: Aug. 7, 2012

(54) METHOD FOR LOW-K DIELECTRIC ETCH WITH REDUCED DAMAGE

(75) Inventors: Bing Ji, Pleasanton, CA (US); Kenji Takeshita, Sunnyvale, CA (US); Andrew D. Bailey, III, Pleasanton, CA (US); Eric A. Hudson, Berkeley, CA (US); Maryam Moravej, Mountain View, CA (US); Stephen M. Sirard, Austin, TX (US); Jungmin Ko, Mountain View, CA (US); Daniel Le, Santa Clara, CA (US); Robert C. Hefty, Laguna Niguel, CA (US); Yu Cheng, Fremont, CA (US); Gerardo A. Delgadino, Milpitas, CA (US); Bi-Ming Yen, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 311 days.

(21) Appl. No.: 12/756,086

(22) Filed: Apr. 7, 2010

(65) Prior Publication Data

US 2010/0261352 A1    Oct. 14, 2010

Related U.S. Application Data

(60) Provisional application No. 61/168,115, filed on Apr. 9, 2009.

(51) Int. Cl.
*B44C 1/22* (2006.01)
*C03C 15/00* (2006.01)
*C03C 25/68* (2006.01)
*C23F 1/00* (2006.01)

(52) U.S. Cl. .......................................... 216/67; 216/37
(58) Field of Classification Search ................ 216/67, 216/37; 438/689
See application file for complete search history.

(56) References Cited

U.S. PATENT DOCUMENTS

| | | | |
|---|---|---|---|
| 6,569,774 B1 | 5/2003 | Trapp | |
| 7,226,852 B1 | 6/2007 | Li et al. | |
| 7,273,815 B2 * | 9/2007 | Sadjadi et al. | 438/689 |
| 2005/0026430 A1 | 2/2005 | Kim et al. | |
| 2007/0020952 A1 | 1/2007 | Lin et al. | |

FOREIGN PATENT DOCUMENTS

KR   10-2009-0012443   2/2009

OTHER PUBLICATIONS

International Search Report dated Oct. 18, 2010 from International Application No. PCT/US2010/030008.
Written Opinion dated Oct. 18, 2010 from International Application No. PCT/US2010/030008.

* cited by examiner

*Primary Examiner* — Roberts Culbert
(74) *Attorney, Agent, or Firm* — Beyer Law Group LLP

(57) ABSTRACT

A method for etching features in a low-k dielectric layer disposed below an organic mask is provided by an embodiment of the invention. Features are etched into the low-k dielectric layer through the organic mask. A fluorocarbon layer is deposited on the low-k dielectric layer. The fluorocarbon layer is cured. The organic mask is stripped.

18 Claims, 4 Drawing Sheets

METHOD FOR LOW-K DIELECTRIC ETCH WITH REDUCED DAMAGE

CROSS REFERENCE TO RELATED APPLICATIONS

This application claims priority under 35 U.S.C. §119(e) to U.S. Provisional Patent Application No. 61/168,115 filed on Apr. 9, 2009, by Ji et al., entitled "METHOD FOR LOW-K DIELECTRIC ETCH WITH REDUCED DAMAGE," which is incorporated by reference in its entirety for all purposes.

BACKGROUND OF THE INVENTION

1. Field of the Invention

The invention relates to a method of obtaining a structure on a semiconductor wafer by etching through a dielectric layer defined by an organic mask using a plasma.

2. Description of the Related Art

In semiconductor plasma etching applications, a plasma etcher is usually used to transfer an organic mask pattern, such as a photoresist mask pattern, into a circuit and line pattern of a desired thin film and/or filmstack (conductors or dielectric insulators) on a Si wafer. This is achieved by etching away the films (and filmstacks) underneath the photoresist materials in the opened areas of the mask pattern. This etching reaction is initiated by the chemically active species and electrically charged particles (ions) generated by exciting an electric discharge in a reactant mixture contained in a vacuum enclosure, also referred to as a reactor chamber. Additionally, the ions are also accelerated towards the wafer materials through an electric field created between the gas mixture and the wafer materials, generating a directional removal of the etching materials along the direction of the ion trajectory in a manner referred to as anisotropic etching. At the finish of the etching sequence, the masking materials are removed by stripping it away, leaving in its place replica of the lateral pattern of the original intended mask patterns.

SUMMARY OF THE INVENTION

To achieve the foregoing and in accordance with the purpose of the present invention, a method for etching features in a low-k dielectric layer disposed below an organic mask is provided. Features are etched into the low-k dielectric layer through the organic mask. A fluorocarbon layer is deposited on the low-k dielectric layer. Subsequently, the fluorocarbon layer is cured, and subsequently the organic mask is stripped.

In another manifestation of the invention a method for etching features in a silicon oxide based low-k dielectric layer with an organic component disposed below a photoresist mask is provided. The silicon oxide based low-k dielectric layer is placed into a plasma processing chamber. Features are etched into the silicon oxide based low-k dielectric layer through the photoresist mask, while simultaneously depositing a fluorocarbon layer on the silicon oxide based low-k dielectric layer in the plasma processing chamber. The fluorocarbon layer is cured in the plasma processing chamber. The photoresist mask is stripped in the plasma processing chamber.

In another manifestation of the invention an apparatus for forming features in a low-k dielectric layer disposed below an organic mask is provided. A plasma processing chamber is provided comprising a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure. A gas source is in fluid connection with the gas inlet and comprises a fluorocarbon deposition gas source, an etching gas source, and a stripping gas source. A controller is controllably connected to the gas source and the at least one electrode, and comprises at least one processor and computer readable media. The computer readable media comprises computer readable code for etching the features into the low-k dielectric layer through the organic mask, comprising computer readable code for providing an etch gas from the etch gas source into the plasma processing chamber and computer readable code for providing energy from the at least one electrode to form the etch gas into a plasma, which etches features into the low-k dielectric layer, computer readable code for depositing a fluorocarbon layer on the low-k dielectric layer, comprising computer readable code for providing a fluorocarbon deposition gas from the fluorocarbon deposition gas source into the plasma processing chamber and computer readable code for providing energy from the at least one electrode to form the fluorocarbon deposition gas into a deposition plasma, which deposits a fluorocarbon layer on the low-k dielectric layer, computer readable code for curing the fluorocarbon layer, and computer readable code for stripping the organic mask, comprising computer readable code for providing a stripping gas from the stripping gas source into the plasma processing chamber and computer readable code for providing energy from the at least one electrode to form the stripping gas into a plasma, which strips the photoresist mask.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
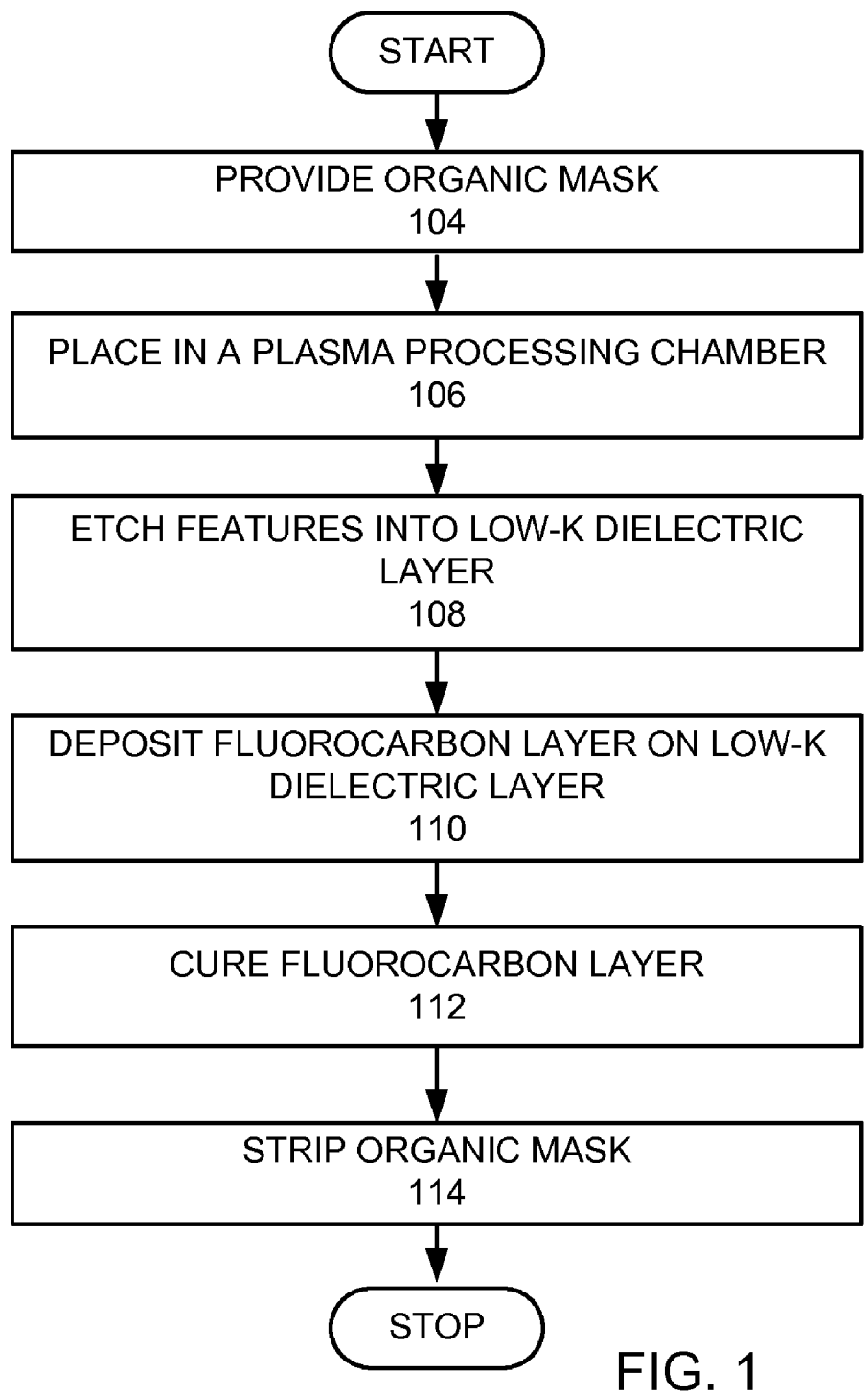
FIG. 1 is a flow chart of an inventive etch process.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In semiconductor via first trench last (VFTL) dual damascene (DD) processing, silicon oxide based low dielectric constant (low-k) materials with added organic component to provide a lower dielectric constant are exposed to various reactants during etch and resist strip process. The exposed low-k dielectric materials are often damaged by etch/strip plasmas and chemicals. In general, low-k damage includes changes in material composition (e.g., carbon depletion), morphology (density or porosity), and/or surface property (e.g., hydrophobic to hydrophilic). The damaged layer no longer posesses the intended dielectric properties, and can lead to device yield loss and/or reliability failures. Therefore reducing damage during low-k dielectric etch/strip has become one of the most critical challenges in semiconductor processing. Unlike the pristine (undamaged) low-k materials, the damaged layer can be readily removed by dilute HF solution. It is a common practice to quantify low-k material damage after etch and strip by measuring the material loss after dipping the sample in dilute HF solution.

Efforts have been made to reduce damage during low-k dielectric etch and strip processes. The prior art methods are primarily in the optimization of etch and strip processes by optimizing process chemistry, hardware configuration, and/or plasma sources (e.g. RF vs. microwave) etc. These prior art efforts have resulted in only limited success. As the dielectric constant (k value) continues to reduce, and the material becomes more porous, and the critical dimension becomes smaller, damage becomes a more severe issue in the most advanced integrated circuit processing.

Another prior art method is to repair the damaged layer after etching and striping of the low-k dielectric materials. Although this approach can repair some of the damages in the low-k dielectric materials, it requires a separate and different tool set. Therefore it increases production cost and decreases throughput.

An embodiment of the invention provides a way to effectively reduce or prevent damage in low-k dielectric dual damascene processing by curing a deposited fluorocarbon layer prior to plasma strip, which can effectively prevent (i.e. reduce) the low-k damage in the subsequent processing. It was unexpectedly discovered that by inserting a curing of a fluorocarbon layer between the etch and the strip steps, the exposed surface layer of the fluorocarbon layer can be controlled or modified such that it is much more resistant to the plasma and/or chemical attacks in the subsequent strip step.

Figure 2A:
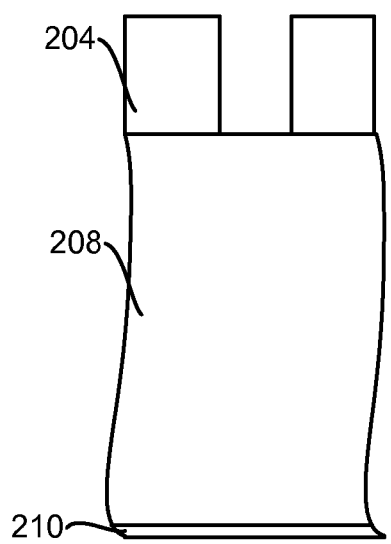
FIGS. 2A-D are schematic views of the formation of a feature using the inventive process.

FIG. 1 is a high level flow chart of an embodiment of the invention. In this embodiment, a patterned organic mask is formed over a low-k dielectric layer (step 104). FIG. 2A is a schematic cross-sectional view of a substrate 210, over which a low-k dielectric layer 208 is disposed, over which a patterned organic mask 204 has been formed. One or more intermediate layers may be disposed between the substrate (wafer) 210 and the low-k dielectric layer 208. One or more intermediate layers, such as an antireflective coating, may be disposed between the low-k dielectric layer 208 and the patterned organic mask 204.

Figure 3:
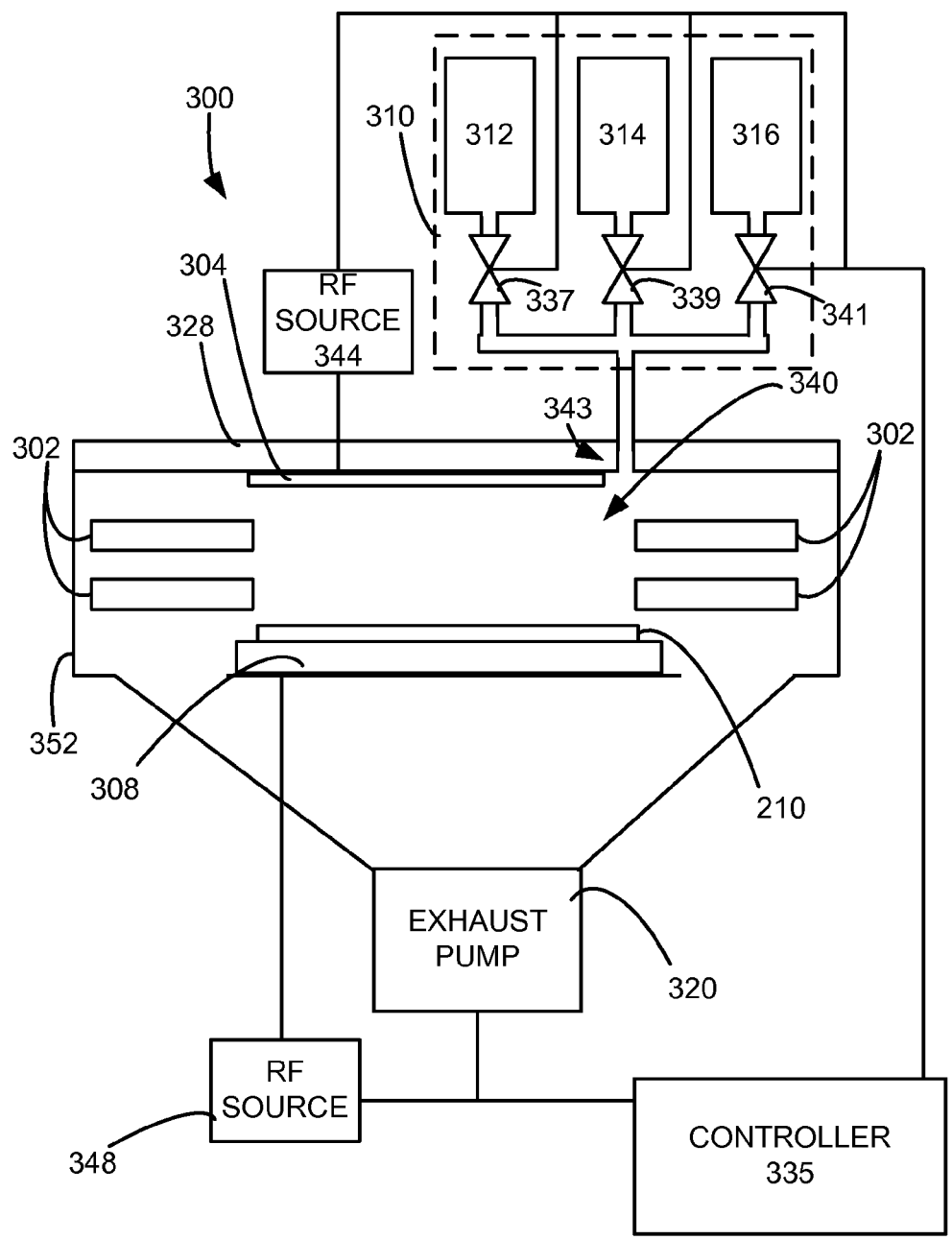
FIG. 3 is a schematic view of a system that may be used in practicing the invention.

The substrate 210 is placed in a plasma processing chamber (step 106). FIG. 3 is a schematic view of a plasma processing chamber 300 that may be used in the preferred embodiment of the invention. In this embodiment, the plasma processing chamber 300 comprises confinement rings 302, an upper electrode 304, a lower electrode 308, a gas source 310, and an exhaust pump 320. The gas source 310 comprises a fluorocarbon gas source 312, an etchant gas source 314, and a stripping gas source 316. Within plasma processing chamber 300, the substrate 210 is positioned upon the lower electrode 308. The lower electrode 308 incorporates a suitable substrate chucking mechanism (e.g., electrostatic, mechanical clamping, or the like) for holding the substrate 210. The reactor top 328 incorporates the upper electrode 304 disposed immediately opposite the lower electrode 308. The upper electrode 304, lower electrode 308, and confinement rings 302 define the confined plasma volume 340. Gas is supplied to the confined plasma volume by gas source 310 through a gas inlet 343 and is exhausted from the confined plasma volume through the confinement rings 302 and an exhaust port by the exhaust pump 320. The exhaust pump 320 forms a gas outlet for the plasma processing chamber. A first RF source 344 is electrically connected to the upper electrode 304. A second RF source 348 is electrically connected to the lower electrode 308. Chamber walls 352 define a plasma enclosure in which the confinement rings 302, the upper electrode 304, and the lower electrode 308 are disposed. Both the first RF source 344 and the second RF source 348 may comprise a 60 MHz power source, a 27 MHz power source, and a 2 MHz power source. Different combinations of connecting RF power to the electrode are possible. A 2300® Exelan® Flex3x dielectric etch system made by Lam Research Corporation™ of Fremont, Calif. may be used in a preferred embodiment of the invention. A controller 335 is controllably connected to the first RF source 344, the second RF source 348, the exhaust pump 320, a first control valve 337 connected to the fluorocarbon gas source 312, a second control valve 339 connected to the etchant gas source 314, and a third control valve 341 connected to the stripping gas source 316. The gas inlet 343 provides gas from the gas sources 312, 314, 316 into the plasma processing enclosure. A showerhead may be connected to the gas inlet 343. The gas inlet 343 may be a single inlet for each gas source or a different inlet for each gas source or a plurality of inlets for each gas source or other possible combinations.

Figure 4A:
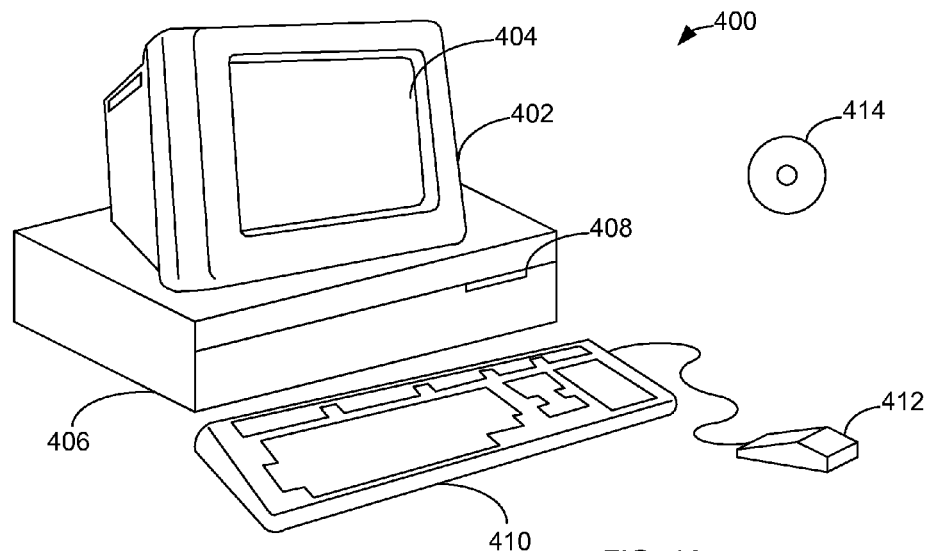
FIGS. 4A-B are schematic views of a computer system that may be used in practicing the invention.
Figure 4B:
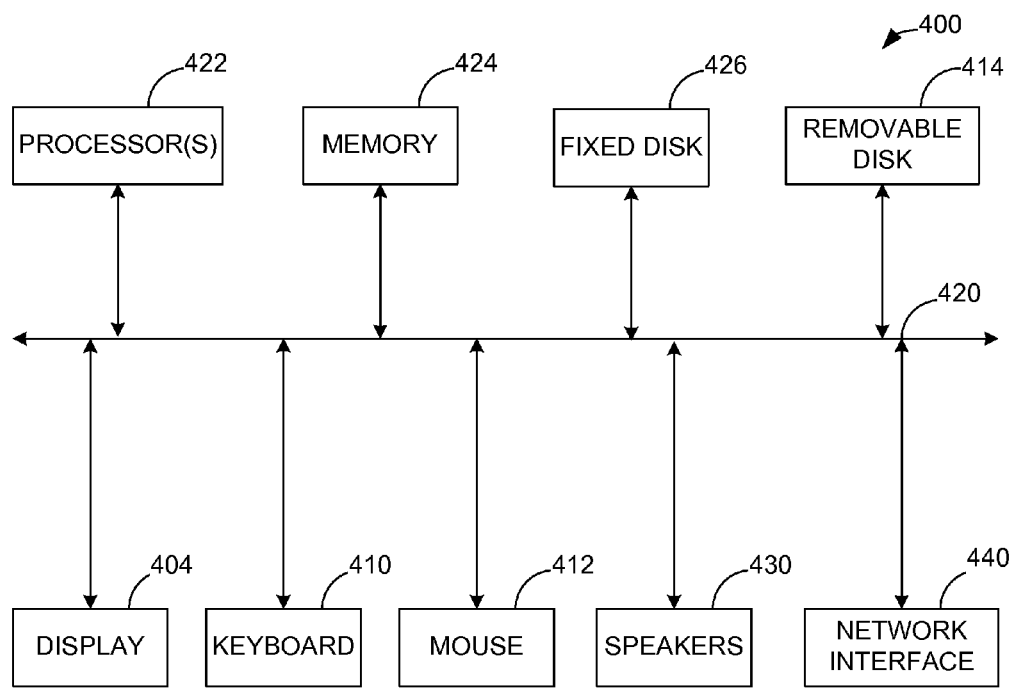

FIGS. 4A and 4B illustrate a computer system 400, which is suitable for using as the controller 335. FIG. 4A shows one possible physical form of a computer system that may be used for the controller 335. Of course, the computer system may have many physical forms ranging from an integrated circuit, a printed circuit board, and a small handheld device up to a huge super computer. Computer system 400 includes a monitor 402, a display 404, a housing 406, a disk drive 408, a keyboard 410, and a mouse 412. Disk 414 is a computer-readable medium used to transfer data to and from computer system 400.

FIG. 4B is an example of a block diagram for computer system 400. Attached to system bus 420 is a wide variety of subsystems. Processor(s) 422 (also referred to as central processing units, or CPUs) are coupled to storage devices, including memory 424. Memory 424 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable type of the computer-readable media described below. A fixed disk 426 is also coupled bi-directionally to CPU 422; it provides additional data storage capacity and may also include any of the computer-readable media described below. Fixed disk 426 may be used to store programs, data, and the like and is typically a secondary storage medium (such as a hard disk) that is slower than primary storage. It will be appreciated that the information retained within fixed disk 426 may, in appropriate cases, be incorporated in standard fashion as virtual memory in memory 424. Removable disk 414 may take the form of any of the computer-readable media described below.

CPU 422 may be also coupled to a variety of input/output devices, such as display 404, keyboard 410, mouse 412, and speakers 430. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 422 optionally may be coupled to another computer or telecommunications network using network interface 440. With such a network interface, it is contemplated that the CPU might receive information from the network, or might output information to the network in the course of performing the above-described method steps. Furthermore, method embodiments of the present invention may execute solely upon CPU 422 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of tangible computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
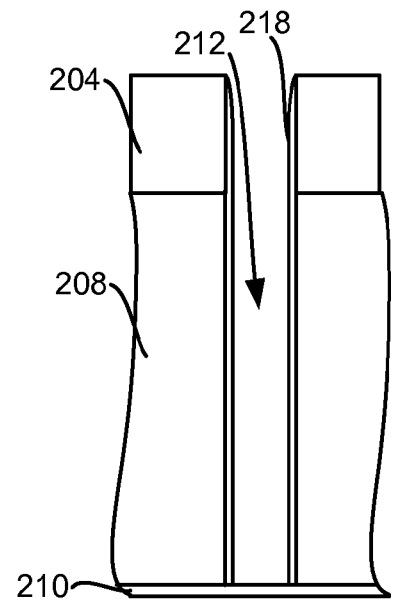

The plasma processing chamber 300 is used to etch features into the low-k dielectric layer 208 through the patterned organic mask 204 (step 108). A fluorocarbon layer is deposited on the low-k dielectric layer 208 (step 110). In a preferred embodiment, etching the features (step 108) and deposition of the fluorocarbon layer (step 110) are performed simultaneously. More preferably, these simultaneous steps selectively deposit on sidewalls of etched features with respect to horizontal surfaces. FIG. 2B is a schematic cross-sectional view of the substrate 210, over which the low-k dielectric layer 208 is disposed, over which the patterned organic mask 204 has been formed after a feature 212 has been etched into the low-k dielectric layer 208 (step 108) and after the fluorocarbon layer 218 has been deposited on sidewalls of the feature 212 of the low-k dielectric layer 208 (step 110). A preferable selective deposition, deposits more on the sidewalls of the features and almost nothing on the horizontal surfaces, as shown in FIG. 2B. In one embodiment, the fluorocarbon layer is pure fluorocarbon. In other embodiments, the fluorocarbon layer has additional additives, such as hydrogen, nitrogen, or sulfur.

Figure 2C:
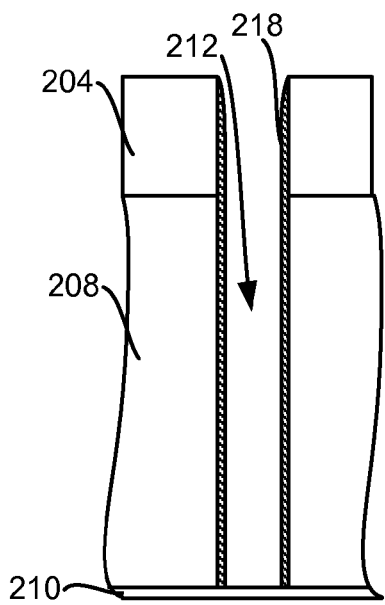

The fluorocarbon layer is then cured (step 112). FIG. 2C is a schematic cross-sectional view where the fluorocarbon layer is shaded to indicate that the fluorocarbon layer is cured.

Figure 2D:
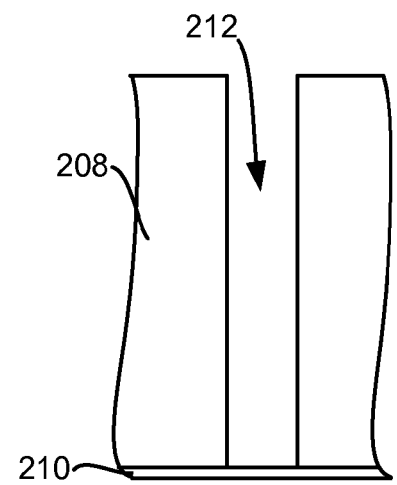

The organic mask is then stripped (step 114). FIG. 2D is a schematic cross-sectional view after the organic mask is stripped. In this embodiment, the fluorocarbon layer 218 is completely stripped away, as shown in FIG. 2D. In another embodiment, the fluorocarbon layer is not completely stripped away.

EXAMPLES

Broken Vacuum

The following example was carried out in a Lam Research Corporation 300 mm dielectric etch reactor (Flex3x). Three comparative low-k via etch and strip runs were conducted. T-1 was a prior art baseline process, where the wafer was etched and stripped the usual manner. In T-2, a 10 minute curing step was inserted between the etch and the strip steps. The curing step is composed of removing the wafer from the etch reactor, exposing it to ambient conditions and curing the fluorocarbon polymer film to promote cross linking. Then the strip process step is resumed in the same dielectric etch chamber. In T-3, a similar curing step is applied, except that the duration to promote polymer cross link is 60 hours. The finished wafers were then inspected by cross section scanning electron microscopy (XSEM). To quantify low-k damage, XSEM inspection was conducted on both as processed samples (without HF dip) and samples dipped in 100:1 HF solution for 45 seconds. To account for hole-to-hole CD (critical dimension) variations, statistical means analysis was used to determine low-k damage after each test. Table-1 summarizes the results.

TABLE 1

| | Low-k via etch and strip damage reduction | | | | | | |
|---|---|---|---|---|---|---|---|
| | CD without HF dip (nm) | | | CD after HF dip (nm) | | | Damage |
| Run# | Top | Middle | Bow | Top | Middle | Bow | (nm) |
| T-1 | 39.9 ± 1.3 | 60.9 ± 1.8 | 21.0 ± 1.5 | 52.6 ± 3.0 | 73.5 ± 2.4 | 20.9 ± 3.2 | 12.6 ± 2.1 |
| T-2 | 39.7 ± 2.2 | 57.2 ± 2.3 | 17.5 ± 2.4 | 51.7 ± 2.3 | 65.0 ± 2.4 | 13.2 ± 2.6 | 7.8 ± 2.4 |
| T-3 | 41.0 ± 2.7 | 59.1 ± 2.2 | 18.1 ± 2.6 | 49.7 ± 3.2 | 61.1 ± 3.2 | 11.3 ± 3.0 | 2.0 ± 2.7 |

In Table 1, the Top and Middle CDs are the via sizes at the top and middle positions respectively. Bow CD is defined as the difference between the middle and the top CDs. Damage is defined as the difference between the middle CDs before and after HF dip. As shown in Table-1, by inserting the curing step between the etch and the strip steps (T-2, and T-3), damage is significantly reduced from the baseline (T-1) process. The longer curing step in T-3 nearly completely eliminated damage. An additional benefit of this method is that bow CD after HF dip is also significantly reduced, as shown on Table-1.

The results are also confirmed by careful inspection of the XSEM images of various samples. Low-k damage is clearly visible as an undercut area just below the top hard mask. Such undercut is significantly reduced in T-2, and completely eliminated in T-3. It has been found that this example reduces bowing and undercutting.

In this example the features have diameters between 40-50 nm and are between 200-250 nm deep. These features were formed in an ultralow-k dielectric with a dielectric constant of 2.4 or less. A low-k dielectric is defined as having a dielectric constant of less than 3.9.

In this example, a main etch of 80 sccm $CF_4$, 160 sccm CO, and 180 sccm AR, at a pressure of 120 mTorr, with power provided by an electrode at 100 Watts at 20 MHz and 1700 Watts at 27 MHz is provided for 17 seconds. An over etch of 100 sccm CO, 6 sccm $C_4F_8$, 90 sccm $N_2$, and 200 sccm Ar at a pressure of 20 mTorr, and with power provided by the same electrode at 500 Watts at 2 MHz, 1000 Watts at 27 MHz, and 300 Watts at 60 MHz is provided for 22 seconds. The use of $C_4F_8$ during the over etch causes the fluorocarbon deposition. As an alternative $C_4F_6$ may be preferably used to provide the fluorocarbon deposition. As an another more generalized alternative, $C_xH_yF_z$ may be used to provide the fluorocarbon deposition. The use of $CF_4$ in the main etch may also add to the fluorocarbon deposition. The fluorocarbon deposition may have a hydrogen component from etched photoresist. The strip process uses a gas of 1000 sccm $CO_2$ at a pressure of 50 mTorr and a power of 1200 watts at 27 MHz for 30 seconds. $CO_2$ is used in this example instead of $O_2$ to provide a less aggressive strip. Other embodiments may use an $O_2$ strip or a combination of $CO_2$ and $O_2$ or other various combinations.

Maintained Vacuum

A test was performed using the above parameters, where the test compared a 60 hour cure time with a broken vacuum with a 60 hour cure time with a maintained vacuum. In one test it was found that the damage where the vacuum was broken was 6.2±2.0, where the damage where the vacuum was maintained was 8.0±2.2. Although the damage where the vacuum was maintained is statistically about equal to the damage where the vacuum was broken, and less than the damage without the curing step, it may be statistically verifiable that the damage when the vacuum is broken is less than the damage when the vacuum is maintained. Although breaking the vacuum may provide less damage, it may be desirable to maintain the vacuum, to simplify the process, since a vacuum is used before and after the curing.

Silylation Cure

In another embodiment the cure is provided by a silylation treatment between the deposition and the stripping. In one example, the silylation is provided by providing a total pressure of 150 Torr with a gas composition of 59% organosilane, 35% $NH_3$, and 6% $N_2$, for 15 minutes. A reduction of damage was found by this curing process.

In one embodiment, etching the low-k materials in a plasma reactor is performed by choosing a process chemistry that not only accomplishes the desired pattern transfer, and also deposits a thin layer of fluorocarbon, such as a fluorocarbon polymer, onto the exposed low-k surface, but further provides that the etch process is modified with the appropriate polymer deposition for optimal bow (profile) control and damage reduction.

Various embodiments provide various methods for curing the fluorocarbon layer, such as providing a curing of the fluorocarbon under ambient conditions over a prescribed length of time, or enhancing polymer cross linking by UV, thermal and/or plasma activation or chemical initiation, various curing (cross linking and removal of dangling bonds) by chemical reaction, etc; or by using various surface activation agents such as water (moisture), and/or free radical initiators added to tie up (terminate) surface free dangling bonds and/or cross link the dangling bonds to enhance curing; or by adding reactants to enhance the conversion of fluorocarbon surface from hydrophilic to hydrophobic properties; or by using curing processes that seal off the exposed open pores in the low-k dielectric surface; or by a curing process that deposits an appropriate thickness of densified low k material that withstands the strip and leaves a good profile for bow and damage control.

In one embodiment, the curing is done for a length of time greater than 5 minutes. In a more preferred embodiment, the curing is done for a length of time over 10 minutes. In a more preferred embodiment the curing is done over a length of time greater than 24 hours. The curing may be performed under vacuum. More preferably, the curing may be performed after the vacuum is broken.

Some of the advantages provided by some of the embodiments of the invention are that they decouple damage and bow reduction from etch and strip optimization. They allow wider process windows to optimize the etch and strip steps for CD control and throughput improvement. Some of the embodiments reduce damage by preventing damage from occurring prior to the strip step. Such embodiments are more effective, and can achieve nearly damage free results under optimal conditions. Some of the embodiments allow the use of the same dielectric etch chamber for both the etch and the strip steps. In these embodiments the same electrode, for example, the lower electrode 308 may be used during the etching, depositing, and stripping. Some embodiments do not require the use of a separate low-k repair module after the etch and strip processes.

In various embodiments, the curing hardens the fluorocarbon layer to make the fluorocarbon layer more resistant to stripping.

While this invention has been described in terms of several preferred embodiments, there are alterations, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method for etching features in a low-k dielectric layer disposed below an organic mask, comprising:
   etching the features into the low-k dielectric layer through the organic mask;
   depositing a fluorocarbon layer on the low-k dielectric layer;
   curing the fluorocarbon layer; and
   stripping the organic mask.

2. The method, as recited in claim 1, wherein the low-k dielectric is a silicon oxide based dielectric with an organic component.

3. The method, as recited in claim 2, wherein the organic mask is a photoresist mask.

4. The method, as recited in claim 3, wherein the curing is performed for at least five minutes.

5. The method, as recited in claim 4, wherein the etching, depositing, curing, and stripping are performed in a single plasma processing chamber.

6. The method, as recited in claim 5, wherein a common electrode in the single plasma processing chamber is used for etching and stripping.

7. The method, as recited in claim 1, wherein the curing is performed for at least ten minutes.

8. The method, as recited in claim 1, wherein the curing is performed for at least 24 hours.

9. The method, as recited in claim 1, wherein the fluorocarbon layer comprises a hydrogen, nitrogen, or sulfur component.

10. The method, as recited in claim 1, wherein at least one of $C_4F_8$ or $C_4F_6$ is used to provide the fluorocarbon deposition.

11. The method, as recited in claim 1, wherein the curing is performed while maintaining a vacuum.

12. The method, as recited in claim 1, wherein the stripping uses a stripping gas ratio with a majority of $CO_2$.

13. The method, as recited in claim 1, wherein the organic mask is a photoresist mask.

14. The method, as recited in claim 1, wherein the curing is performed for at least five minutes.

15. The method, as recited in claim 1, wherein the etching, depositing, curing, and stripping are performed in a single plasma processing chamber.

16. The method, as recited in claim 15, wherein a common electrode in the single plasma processing chamber is used for etching and stripping.

17. A method for etching features in a silicon oxide based low-k dielectric layer with an organic component disposed below a photoresist mask, comprising
    providing the silicon oxide based low-k dielectric layer into a plasma processing chamber;
    etching features into the silicon oxide based low-k dielectric layer through the photoresist mask, while simultaneously depositing a fluorocarbon layer on the silicon oxide based low-k dielectric layer in the plasma processing chamber;
    curing the fluorocarbon layer in the plasma processing chamber; and
    stripping the photoresist mask in the plasma processing chamber.

18. An apparatus for forming features in a low-k dielectric layer disposed below an organic mask, comprising:
    a plasma processing chamber, comprising:
        a chamber wall forming a plasma processing chamber enclosure;
        a substrate support for supporting a substrate within the plasma processing chamber enclosure;
        a pressure regulator for regulating the pressure in the plasma processing chamber enclosure;
        at least one electrode for providing power to the plasma processing chamber enclosure for sustaining a plasma;
        a gas inlet for providing gas into the plasma processing chamber enclosure; and
        a gas outlet for exhausting gas from the plasma processing chamber enclosure;
    a gas source in fluid connection with the gas inlet, comprising:
        a fluorocarbon deposition gas source;
        an etching gas source; and
        a stripping gas source; and
    a controller controllably connected to the gas source and the at least one electrode, comprising:
    at least one processor; and
    computer readable media, comprising:
        computer readable code for etching the features into the low-k dielectric layer through the organic mask, comprising:
            computer readable code for providing an etch gas from the etch gas source into the plasma processing chamber; and
            computer readable code for providing energy from the at least one electrode to form the etch gas into a plasma, which etches features into the low-k dielectric layer;
        computer readable code for depositing a fluorocarbon layer on the low-k dielectric layer, comprising:
            computer readable code for providing a fluorocarbon deposition gas from the fluorocarbon deposition gas source into the plasma processing chamber; and
            computer readable code for providing energy from the at least one electrode to form the fluorocarbon deposition gas into a deposition plasma, which deposits a fluorocarbon layer on the low-k dielectric layer;
        computer readable code for curing the fluorocarbon layer; and
        computer readable code for stripping the organic mask, comprising:
            computer readable code for providing a stripping gas from the stripping gas source into the plasma processing chamber; and
            computer readable code for providing energy from the at least one electrode to form the stripping gas into a plasma, which strips the photoresist mask.

* * * * *